United States Patent [19]

Iwata

[11] Patent Number: 5,111,063
[45] Date of Patent: May 5, 1992

[54] INTEGRATED CLOCK DRIVER CIRCUIT

[75] Inventor: Toshiki Iwata, Tokyo, Japan

[73] Assignee: NEC Corporation, Tokyo, Japan

[21] Appl. No.: 474,613

[22] Filed: Feb. 5, 1990

[30] Foreign Application Priority Data

Feb. 3, 1989 [JP] Japan .................................... 1-24855

[51] Int. Cl.⁵ ........................ H03K 5/13; H03K 19/00
[52] U.S. Cl. .................................... 307/269; 307/480;
307/475; 328/63; 328/72
[58] Field of Search ............ 307/480, 269, 475, 247.1;
328/63, 72

[56] References Cited

U.S. PATENT DOCUMENTS

| 4,438,404 | 3/1984 | Philipp ................................. 328/63 |
| 4,529,895 | 7/1985 | Garverick et al. .................. 307/592 |
| 4,618,786 | 10/1986 | Johnson ............................. 307/482 |
| 4,816,700 | 3/1989 | Imel ................................... 307/269 |
| 4,929,854 | 5/1990 | Iino et al. ........................... 307/269 |
| 4,933,571 | 6/1990 | Pribyl ................................. 307/480 |

Primary Examiner—Timothy P. Callahan
Attorney, Agent, or Firm—Sughrue, Mion, Zinn, Macpeak & Seas

[57] ABSTRACT

An integrated circuit comprises a first clock driver responsive to an external clock signal and producing a first clock signal, a second clock driver responsive to the first clock signal and producing a second clock signal delayed from the first clock signal, an internal circuit responsive to the second clock signal and producing an output data signal, and an output circuit coupled to a data output pin and transferring the output data signal to the data output pin in synchronization with the first clock signal, so that a time interval between the production of the output data signal and the validity at the data output pin is shrunk even though a large parasitic capacitance is coupled to the data output pin.

9 Claims, 6 Drawing Sheets

INTEGRATED CLOCK DRIVER CIRCUIT

FIELD OF THE INVENTION

This invention relates to a large scale integrated circuit fabricated on a semiconductor chip and, more particularly to a clock driver circuit incorporated in the integrated circuit.

DESCRIPTION OF THE RELATED ART

A typical example of a large scale integration such as a microprocessor is responsive to a high frequency clock signal of 30 MHz to 50 MHz, however, such a high speed integrated circuit has a problem in that delay is introduced in a signal transmission at the output data signal terminal or pin due to a large parasitic capacitance coupled thereto. A signal propagation in the integrated circuit is effectively enhanced through a shrinkage of device dimension because undesirable internal parasitic capacitances are decreased depending upon the device dimension thus shrunk. However, the parasitic capacitance coupled to the signal output terminal remains large, and, for this reason, the signal transmission tends to be delayed even though the internal signal propagation is improved.

Two approaches are proposed so as to solve the problem due to the large parasitic capacitance coupled to the signal output terminal.

The first approach is that an output buffer circuit associated with the signal output terminal is enlarged in transistor size. If the transistor size is large enough to drive the external parasitic capacitance, the output signal is rapidly transmitted to a destination. However, the first approach encounters another problem in noises or voltage fluctuation due to a large amount of current flowing through power supply lines upon a switch of the output buffer. In order to eliminate undesirable affections due to a large amount of the current, the signal transmission is hardly improved in speed.

On the other hand, the second approach is to enlarge the clock driver in the transistor size. The clock driver is used for producing a driving clock signal. However, the second approach has still another problem in a large parasitic capacitance coupled to the clock driver circuit. Such a large parasitic capacitance introduces a delay in the internal signal propagation, so that the improvement in the signal transmission is partially canceled by the internal delay due to the large parasitic capacitance.

SUMMARY OF THE INVENTION

It is therefore an important object of the present invention to provide an integrated circuit which is improved in signal transmission speed at the signal output terminal.

To accomplish these objects, the present invention proposes to produce first and second clock signals different in phase for controlling an output circuit and an internal circuit, respectively.

In accordance with the present invention, there is provided an integrated circuit comprising a first clock driver responsive to a system clock signal for producing a first clock signal, and a second clock driver coupled to the first clock driver in such a manner as to be supplied with the first clock signal for producing a second clock signal, in which the first clock signal is supplied to an output circuit for driving an output pin, and in which the second clock signal is supplied to a internal circuit for controlling an operation thereof.

BRIEF DESCRIPTION OF THE DRAWINGS

The features and advantages of an integrated circuit according to the present invention will be more clearly understood from the following description taken in conjunction with the accompanying drawings in which.

DESCRIPTION OF THE PREFERRED EMBODIMENTS

First Embodiment

Figure 1:
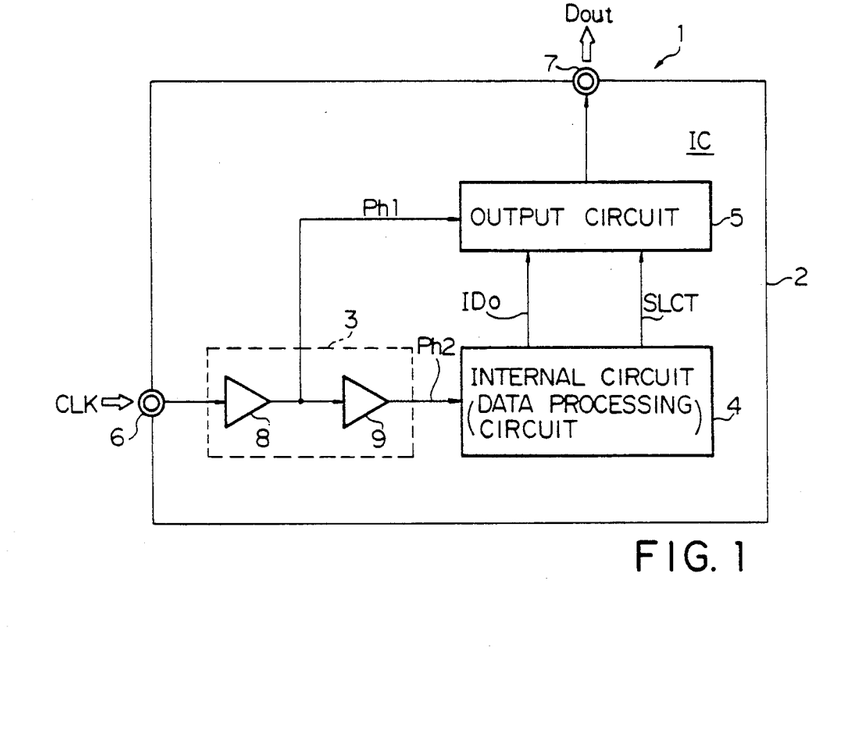
FIG. 1 is a block diagram showing the arrangement of an integrated circuit embodying the present invention.

Referring first FIG. 1 of the drawings, an integrated circuit 1 such as, for example, a microprocessor is fabricated on a single semiconductor chip 2 and largely comprises a clock driver circuit 3, an internal circuit or a data processing circuit 4 and an output circuit 5. A clock pin 6 is coupled to the clock driver circuit 3, and a system clock signal CLK is supplied from an external clock source (not shown) to the clock pin 6. The output circuit 5 drives an output data pin 7 in response to a first timing clock signal Ph1 and an internal data IDo to be outputted, and, then, supplies an output data signal Dout to a destination not shown through a signal line (not shown). Although a plurality of output circuits respectively associated with output pins are provided to the integrated circuit and selectively activated with a selecting signal SLCT see FIG. 3), FIG. 1 shows only a single set of the output circuit 5 and the associated data pin 7 for the sake of simplicity.

Figure 2:
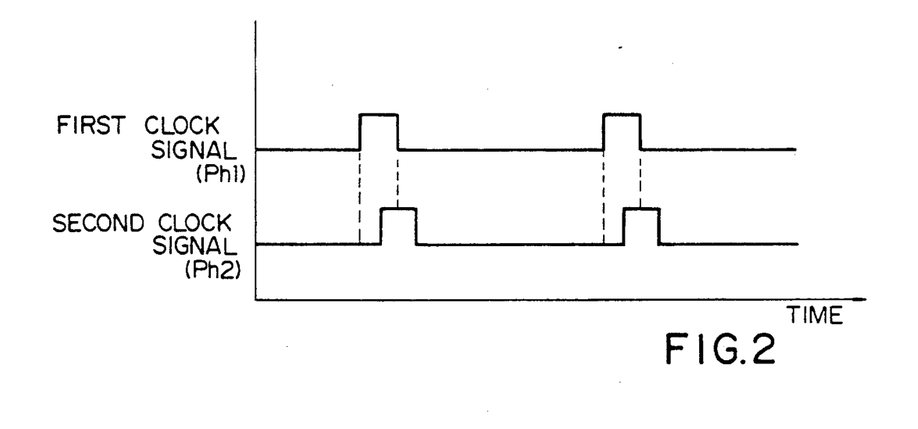
FIG. 2 is a graph showing the waveforms of first and second clock signals produced by a clock diver circuit incorporated in the integrated circuit shown in FIG. 1.

The clock driver circuit 3 is implemented by a series combination of first and second clock driver circuits 8 and 9. The first clock driver circuit 8 further serves as an input buffer circuit and produces a first timing control clock signal Ph1 which is fed to the second clock driver circuit 9 as well as to the output circuit 5. The output circuit 5 drives the output pin 7 in synchronism with the first timing control clock signal Ph1. With the first timing control clock signal Ph1 the second clock driver circuit 9 produces the second timing control clock signal Ph2, and the data processing circuit 4 achieves data processing in synchronism with the second timing control clock signal Ph2 for producing the internal data signal IDo to be outputted. A time delay is introduced in the production of the second timing control clock signal Ph2, and, for this reason, the first timing control signal Ph1 is ahead of the second timing control clock signal Ph2 as will be seen from FIG. 2. Therefore, the output circuit 5 drives the output pin 7 earlier than when it drive the pin 7 with the second clock signal. Even though a large amount of parasitic capacitance is coupled to the output pin 7, the drive of the output pin 7 is completed while the data processing unit 4 keeps the internal data signal IDo valid. This means that the driving speed at the output pin 7 is increased in accordance with the improved operating speed of the data processing unit 4.

Figure 3:
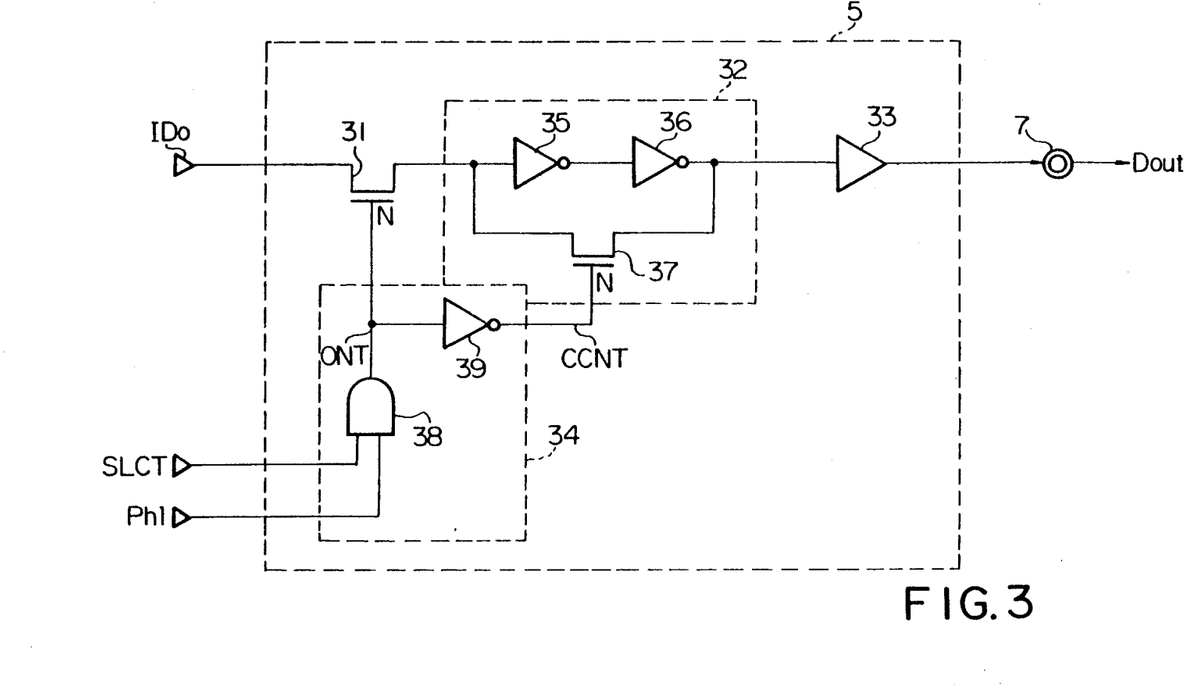
FIG. 3 is a block diagram showing the arrangement of an output circuit incorporated in the integrated circuit shown in FIG. 1.

Turning to FIG. 3 of the drawings, the output circuit 5 comprises a first gate transistor 31, a latch circuit 32, an output buffer circuit 33 and a controlling circuit 34. The latch circuit 32 is implemented by a series combination of inverter circuits 35 and 36 coupled to a second gate transistor 37. The controlling circuit 34 has a two-input AND gate 38 and an inverter circuit 39, and the first timing control clock signal Ph1 and the selecting signal SLCT are supplied to the respective input nodes of the AND gate 38. When both of first timing control signal Ph1 and the selecting signal SLCT concurrently rise to respective active high levels, the AND gate 38 produces a gate control signal CNT fed to the first gate transistor 31, and the inverter circuit 39 supplies the complementary gate control signal CCNT to the second gate transistor 37. Thus, the gate control signal CNT and the complementary signal thereof are fed in parallel to the first and second gate transistors 31 and 37, and, for this reason, the first and second gate transistors 31 and 37 are complementarily shifted between on and off states. Namely, if the gate control signal CNT rises to the active high level, the complementary gate control signal CCNT goes down to the deactive low level, and the internal data signal IDo to be outputted is transferred into the latch circuit 32 through the first gate transistor 31. However, even though the selecting signal SLCT remains in the active high level, the AND gate 38 shifts the gate control signal CNT to the deactive low level in the absence of the first timing control clock signal Ph1 of the high level, so that the first gate transistor 31 turns off but the second gate transistor 37 turns on for retaining the internal data signal IDo to be outputted. The internal data signal IDo to be outputted is supplied to the output buffer circuit 33, and the output buffer circuit 33 in turn drives the output pin 7 to output the output data signal Dout.

Figure 4:
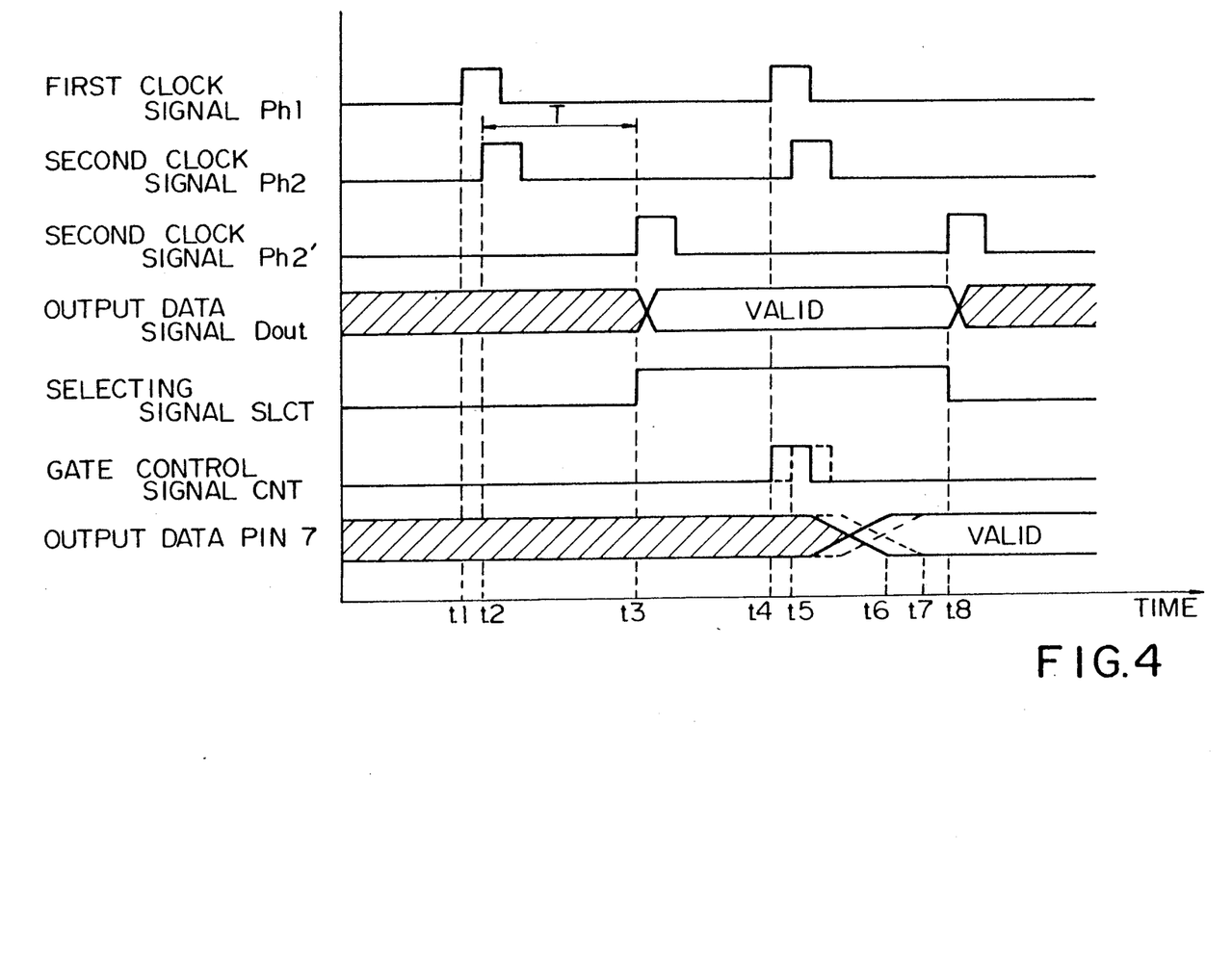
FIG. 4 is a timing chart showing the waveforms of essential signals produced in the integrated circuit shown in FIG. 1.

Assuming now that the first clock driver circuit 8 produces the first timing control clock signal Ph1 at time t1 as shown in FIG. 4, the second clock driver circuit 9 produces the second timing control clock signal Ph2 delayed from the first timing control clock signal Ph1 at time t2. With the second timing control clock signal Ph2, the data processing circuit 4 internally produces a second timing control clock signal Ph2' which is spaced from the second timing clock signal Ph2 by 180 degrees (T).

The data processing circuit 4 has controlled component transistors in synchronism with the timing control clock signals Ph2 and Ph2' and achieves a given task for producing the internal data signal IDo to be outputted. This data signal IDo is transferred to the first gate transistor 31 in synchronism with the leading edge of the timing control clock signal Ph2', and the data processing circuit 4 allows the selecting signal SLCT to rise to the active high level in synchronism with the leading edge of Ph2' (at time t3). The data signal IDo is valid between a certain leading edge of the timing control clock signal Ph2' (time t3) and the next leading edge thereof (time t8). The selecting signal SLCT is recovered to the deactive low level at time t8.

Since the NAND gate 38 is supplied with the selecting signal SLCT and the first clock signal PH1, the gate control signal CNT rises to the high voltage level in synchronism with the first clock signal Ph1 as shown in FIG. 4. As a result, the transfer gates 31 and 37 turn on and off, respectively, the internal data signal IDo to be outputted is transferred through the transfer gate 31 and the inverter circuits 35 and 36 to the output buffer circuit 33. In addition, the variation at the output terminal is delayed from the inverting timing of the gate control signal CNT due to the transfer gate 31, inverter circuits 35 and 36 and the output buffer circuit 33. The output buffer circuit 33 drives the output data pin 7 depending upon the voltage level of the internal data signal IDo to be outputted. Since the parasitic capacitance coupled to the output data pin 7 is relatively large, the variation in voltage level at the output data pin 7 is relatively slow as shown in FIG. 4. However, the output buffer circuit 33 previously drives the output data pin 7 in synchronism with the first clock signal Ph1 ahead of the second clock signal, the variation is completed with a valid time interval as shown in FIG. 4 even if the valid time interval is shrunk in accordance with an increase in speed of the data processing unit 4.

On the other hand, if the second clock signal Ph2 is used for controlling the output circuit 5 similar to the prior art microprocessor, the gate control signal CNT rises to the high level in synchronism with the second clock signal Ph2 at time 5 as indicated by dash lines in FIG. 4, so that the variation at the output data pin 7 is delayed to time t7. In this situation, if the valid time period is shrunk in accordance with the speed up of the data processing unit 4, the variation at the output data pin 7 is hardly completed within the valid time period. This sets limitations to the speed up of the microprocessing unit 4. However, the output data buffer circuit 5 is actually controlled with the first clock signal Ph1 in accordance with the present invention, the integrated circuit 1 is improved in the operation speed regardless of the large parasitic capacitance.

Second Embodiment

Figure 5:
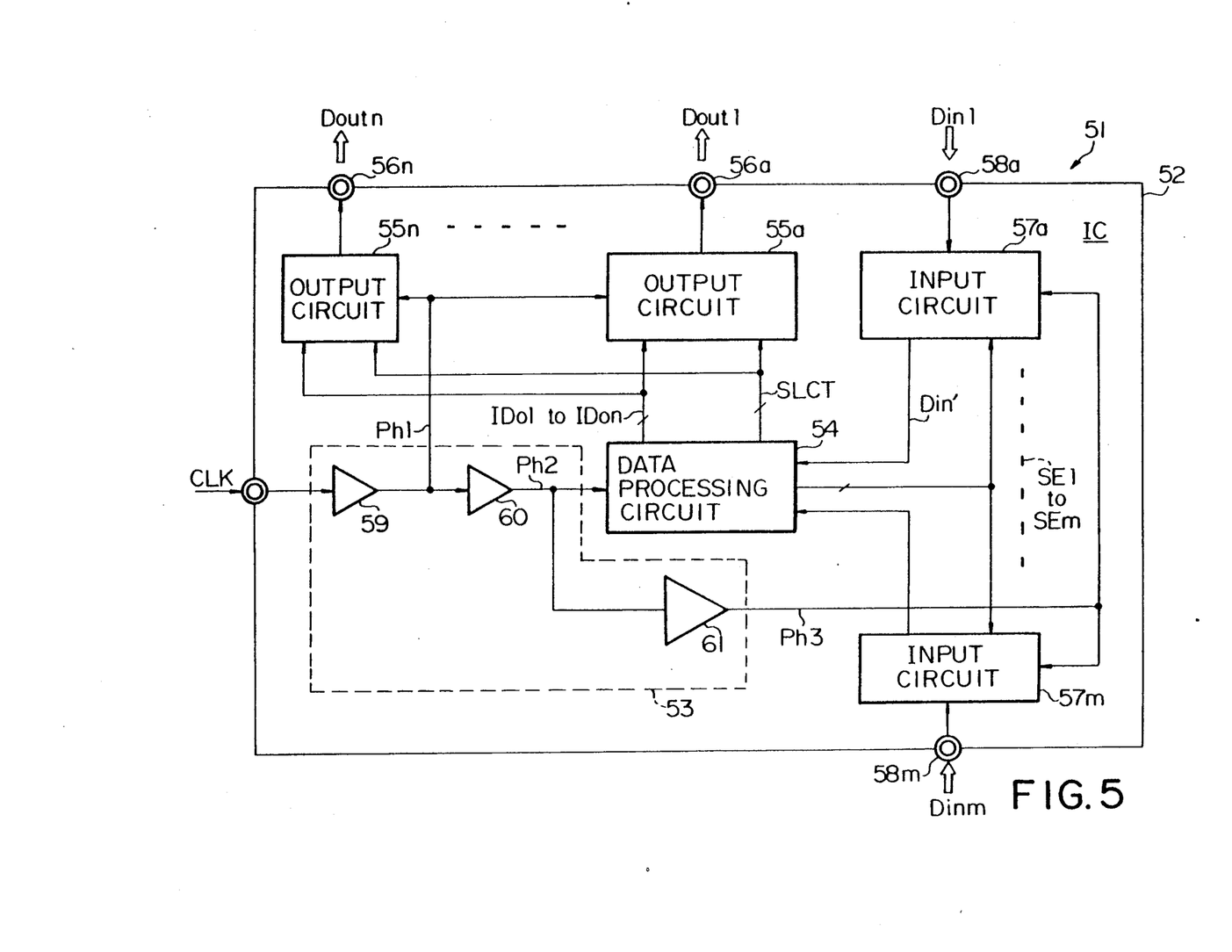
FIG. 5 is a block diagram showing the arrangement of another integrated circuit embodying the present invention.

Turning to FIG. 5, another integrated circuit 51 according to the present invention is fabricated on a single semiconductor chip 52 and largely comprises a clock driver circuit 53, a data processing circuit 54, a plurality of output circuits 55a to 55n respectively associated with output data pins 56a to 56n and a plurality of input circuits 57a to 57m similarly associated with input data pins 58a to 58m, respectively. The data processing unit 54, and each of the output circuits 55a to 55n are similar in circuit arrangement to those shown in FIG. 1, and, for this reason, no detailed description of these circuits are provided.

The clock driver circuit 53 comprises a series combination of first to third clock drivers 59, 60 and 61, and the first clock driver 59 is responsive to a system clock CLK for producing a first timing control clock signal Ph1. The second clock driver 60 produces a second timing control clock signal Ph2 on the basis of the first timing control clock signal Ph1, and the second timing control clock signal Ph2 is fed to the third clock driver 61 for producing a third timing control clock signal Ph3. The first and second timing control clock signal Ph1 and Ph2 are respectively supplied to the output circuits 55a to 55n and the data processing circuit 54 and are used for controlling the circuits similar to those incorporated in the microprocessor 1.

Figure 6:
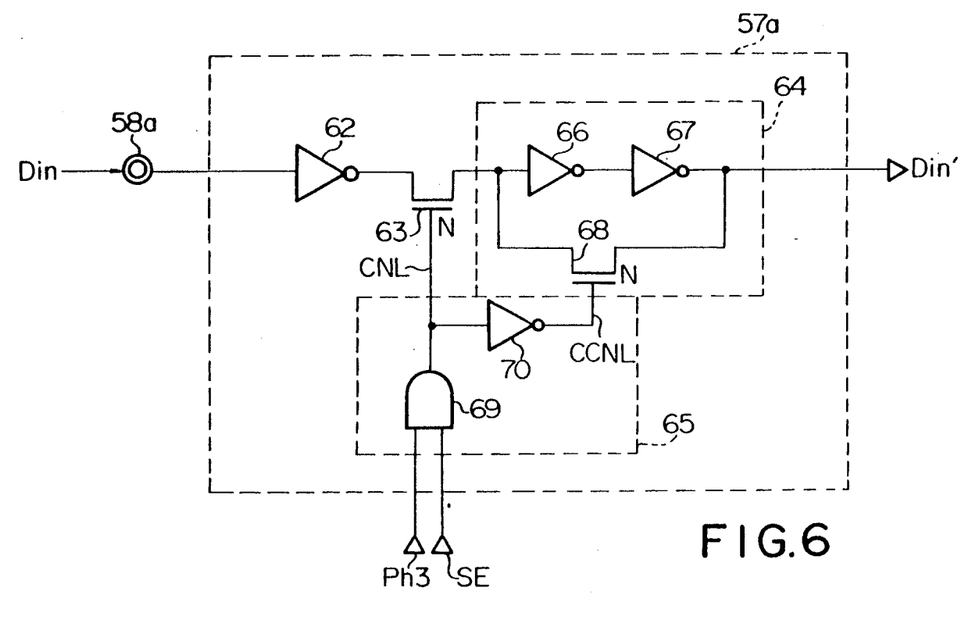
FIG. 6 is a block diagram showing the arrangement of a output circuit incorporated in the integrated circuit shown in FIG. 5.

All of the input circuits 57a to 57m are identical in circuit arrangement with one another, and, for this reason, description is focused only upon the input circuit 57a. As will be seen in FIG. 6, the input circuit 57a comprises an input buffer circuit 62, a third gate transistor 63, a latch circuit 64 and a control circuit 65. The latch circuit 64 is implemented by a loop consisting of inverter circuits 66 and 67 and a fourth gate transistor 68, and an AND gate 69 and an inverter circuit 70 form in combination the control circuit 65. An input data signal Din1 is fed to the input data pin 58a and transferred to the input data buffer circuit 62. The third timing control clock signal Ph3 and a selecting signal SE from the data processing circuit 54 are supplied to the AND gate 69 which yields a gate control signal CNL of an active high level in the copresence of the signals of the active high level. The inverter circuit 70 produces a complementary gate control signal CCNL, and the gate control signal CNL and the complementary signal thereof CCNL are supplied to the third and fourth gate transistors 63 and 68, respectively, so that the third and fourth gate transistors 63 and 68 are complementarily shifted between on and off states. As will be seen in FIG. 7, the third timing control clock signal Ph3 is slightly delayed from the second timing control clock signal Ph2.

Figure 7:
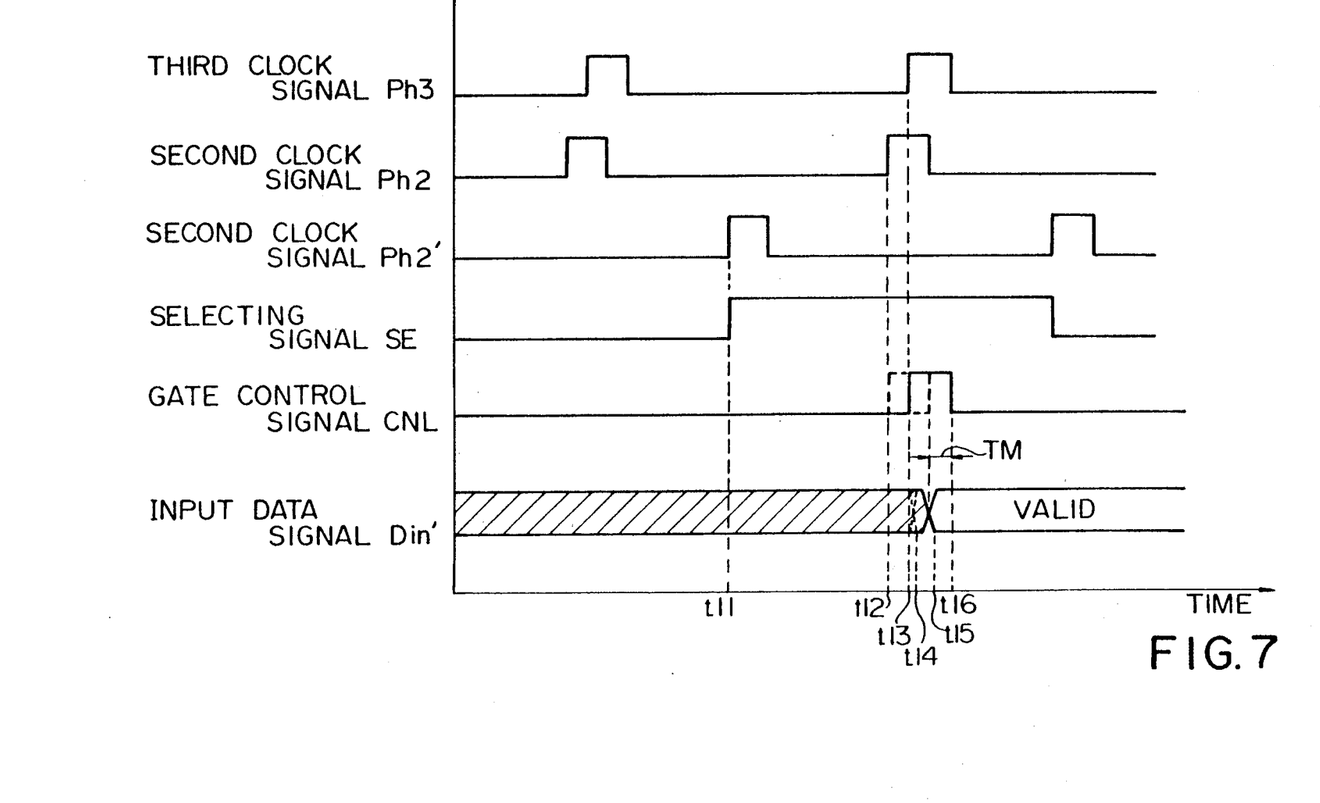
FIG. 7 is a timing chart showing the waveforms of essential signals produced in the integrated circuit shown in FIG. 5.

Assuming now that the data processing circuit 54 requests the input circuit 57a to transfer the input data signal Din1 thereto with the selecting signal SE in synchronism with the delayed second timing control clock signal Ph2' at time t11, the AND gate 69 produces the gate control signal CNL of the active high level in synchronization with the third timing control clock signal Ph3 at time t13. With the gate control signal CNL of the active high level, the third gate transistor 63 turns on to pass the input data signal Din1, and the input data signal Din1 reaches the latch circuit 64. When the third timing control clock signal Ph3 is recovered to the deactive low level, the gate control signal CNL is also recovered to the deactive low level, but the complementary gate control signal CCNL rises to the active high level, so that the input data bit Din1 is retained in the latch circuit 64. The input data signal Din1 thus retained in the latch circuit 64 is supplied to the data processing circuit 54 as the input data signal Din1', and the input data bit indicated by the signal din' becomes valid at time t15. The reason why a time interval takes place between times t13 and t15 is that the third gate transistor 63 and the inverter circuits 66 and 67 introduce a small amount of time delay in the signal propagation.

If the second timing control clock signal Ph2 is fed to the AND gate 69 instead of the third timing control clock signal Ph3, the gate control signal CNL is produced at time t12 slightly ahead of time t13, and the input data bit becomes valid at time t14. However, this advancement should be supported by an input data source (not shown), so that the input data source needs to have a large signal driving capability for advancing the input data by a time interval TM. However, the input data source coupled to the input data pin Din1 is allowed to gradually shift the input data signal Din1 is allowed to gradually shift the input data signal Din1 by virtue of the third timing control clock signal Ph3. If the signal driving capability of the input data source is large enough to rapidly shift the input data signal Din1, the data signal Din1 is surely accepted by the input circuit 57a by virtue of the third timing control clock signal Ph3. Moreover, even if the input data source retards the data set up, the input data signal Din1 reaches the input circuit 57a, and is surely transferred to the data processing circuit 54.

As will be understood from the foregoing description, since the output circuit is controlled by the first timing control clock signal Ph1 ahead of the second timing clock signal Ph2, the time delay at the data output pin 7 is decreased, which is conducive to a speed up of the integrated circuit.

Although particular embodiments of the present invention have been shown and described, it will be obvious to those skilled in the art that various changes and modifications may be made without departing from the spirit and scope of the present invention.

What is claimed is:

1. An integrated circuit comprising:
    a) a clock signal producing circuit having a first clock driver responsive to a system clock signal and producing a first clock signal and a second clock driver responsive to the first clock signal, and producing a second clock signal delayed from the first clock signal,
    b) an internal circuit responsive to said second clock signal and producing an output data signal; and
    c) an output circuit coupled to a data output pin, said output circuit being responsive to said first clock signal for transferring said output data signal to the data output pin; wherein said output circuit comprises: a controlling circuit responsive to a selecting signal fed from the internal circuit and to said first clock signal fed from said first clock driver for producing a gate control signal and the complementary gate control signal, a latch circuit responsive to said complementary gate control signal for retaining said output data signal, a first gate transistor supplied with said output data signal fed from the internal circuit and responsive to said gate control signal for transferring the output data signal to the latch circuit, and an output buffer circuit coupled between the latch circuit and said data output pin.

2. An integrated circuit as set forth in claim 1, in which said latch circuit is implemented by a loop consisting of a series combination of inverter circuits and a second gate transistor supplied with said complementary gate control signal.

3. An integrated circuit as set forth in claim 1, in which said controlling circuit has an AND gate supplied with said selecting signal and said first clock signal for producing said gate control signal and an inverter circuit for producing said complementary gate control signal.

4. An integrated circuit comprising:
    a) a clock signal producing circuit having a first clock driver responsive to a system clock signal and producing a first clock signal and a second clock driver responsive to the first clock signal and Producing a second clock signal delayed from the first clock signal;
    b) an internal circuit responsive to said second clock signal and producing an output data signal; and
    c) an output circuit coupled to a data output pin, said output circuit being responsive to said first clock signal for transferring said output data signal to the data output pin, in which said integrated circuit further comprises a third clock driver, coupled to said second clock driver, for producing a third clock signal delayed from said second clock signal, an input data pin supplied with an input data signal, and an input circuit responsive to the third clock signal and supplying the input data signal to said internal circuit.

5. An integrated circuit as set forth in claim 4, in which said input circuit comprises an input data buffer circuit coupled to said input data pin, a controlling circuit responsive to a selecting signal fed from the internal circuit for producing a gate control signal and the complementary gate control signal in response to said third clock signal, a latch circuit operative to retain said input data signal in the presence of said complementary gate control signal and supplying the input data signal to said internal circuit, and a third gate transistor coupled between the input data buffer circuit and the latch circuit and operative to transfer the input data signal to the latch circuit in the presence of the gate control signal.

6. An integrated circuit as set forth in claim 5, in which said latch circuit is implemented by a loop consisting of a series combination of inverter circuits and a fourth gate transistor supplied with said complementary gate control signal.

7. An integrated circuit as set forth in claim 5, in which said controlling circuit has an AND gate supplied with said selecting signal and said third clock signal for producing said gate control signal and an inverter circuit for producing said complementary gate control signal.

8. An integrated circuit comprising:
   a) a first clock driver circuit supplied with a system clock signal and producing a first clock signal;
   b) a second clock driver circuit coupled to an output node of said first clock driver circuit and supplied with said first clock signal for producing a second clock signal delayed in phase from said first clock signal;
   c) an output terminal;
   d) a logic circuit responsive to said second clock signal and performing a logical operation for producing a data signal supplied to said output terminal; and
   e) an output circuit coupled between said logic circuit and said output terminal and responsive to said first clock signal for latching said data signal, said output circuit being further operable for driving said output terminal, in which said output circuit comprises: a first inverting circuit, a second inverting circuit having an input node which is coupled to an output node of said first inverting circuit, a first transfer gate coupled between said logic circuit and an input node of said first inverting circuit, a second transfer gate coupled between the input node of said first inverting circuit and an output node of said second inverting circuit, a driving circuit responsive to an output level of said second inverting circuit for driving said output terminal, and first means responsive to the leading edge of said first clock signal for allowing said first and second transfer gates to turn on and off, respectively, said first means further being responsive to the trailing edge of said first clock signal for allowing said first and second transfer gates to turn off and on, respectively.

9. An integrated circuit comprising
   a) a clock signal producing circuit having a first clock driver responsive to a system clock signal and producing a first clock signal and a second clock driver responsive to the first clock signal and producing a second signal delayed from the first clock signal,
   b) an internal circuit responsive to said second clock signal and producing an output data signal, and
   c) an output circuit coupled to a data output pin and transferring said output data signal to the data output pin in synchronization with said first clock signal.

* * * * *

UNITED STATES PATENT AND TRADEMARK OFFICE
CERTIFICATE OF CORRECTION

PATENT NO. : 5,111,063

DATED : May 5, 1992

INVENTOR(S) : Toshiki IWATA

It is certified that error appears in the above-identified patent and that said Letters Patent is hereby corrected as shown below:

Col. 3, line 4, delete "drive" and insert --drives--.

Col. 5, line 65, delete "allowed to gradually shift the input data signal Din 1 is".

Signed and Sealed this

Twenty-eighth Day of September, 1993

Attest:

BRUCE LEHMAN

Attesting Officer

Commissioner of Patents and Trademarks